(12) United States Patent
Park et al.

(10) Patent No.: US 7,679,275 B2
(45) Date of Patent: Mar. 16, 2010

(54) DISPLAY FILTER AND DISPLAY DEVICE INCLUDING THE SAME

(75) Inventors: Dae-chul Park, Suwon-si (KR); Jae-young Choi, Seoul (KR); Tae-soon Park, Suwon-si (KR); Sang-cheol Jung, Seongnam-si (KR)

(73) Assignee: Samsung Corning Co., Ltd., Suwon-si (KR)

( * ) Notice: Subject to any disclaimer, the term of this patent is extended or adjusted under 35 U.S.C. 154(b) by 1112 days.

(21) Appl. No.: 11/322,113

(22) Filed: Dec. 28, 2005

(65) Prior Publication Data

US 2006/0145578 A1 Jul. 6, 2006

(30) Foreign Application Priority Data

Jan. 4, 2005 (KR) .................... 10-2005-0000473
Nov. 11, 2005 (KR) .................... 10-2005-0108198

(51) Int. Cl.
*H01K 1/26* (2006.01)
*H01J 17/49* (2006.01)

(52) U.S. Cl. ....................... 313/112; 313/587

(58) Field of Classification Search ......... 313/582–587; 359/455–457, 460, 452–453, 443
See application file for complete search history.

(56) References Cited

U.S. PATENT DOCUMENTS

| 6,657,387 | B1 * | 12/2003 | Yoo | .................... | 313/587 |
| 7,271,955 | B2 * | 9/2007 | Osawa et al. | ................ | 359/453 |
| 2001/0004279 | A1 * | 6/2001 | Sako et al. | .................. | 349/158 |
| 2005/0128380 | A1 * | 6/2005 | Zieba et al. | .................. | 349/96 |

FOREIGN PATENT DOCUMENTS

| EP | 1 107 025 A2 | 6/2001 |
| EP | 1 471 559 A1 | 10/2004 |
| JP | 6-504627 | 5/1994 |
| JP | 2000323049 | 11/2000 |
| JP | 2000352608 | 12/2000 |
| JP | 2001-034183 | 2/2001 |
| JP | 2001034183 | 2/2001 |
| JP | 2002097383 | 4/2002 |
| JP | 2003-066206 | 3/2003 |
| JP | 2004-012918 | 1/2004 |
| JP | 2004012918 | 1/2004 |
| JP | 2004-062099 | 2/2004 |

(Continued)

OTHER PUBLICATIONS

Japanese Office Action issued in Japanese Patent Application No. JP 2005-380636, dated Aug. 14, 2007.

*Primary Examiner*—Nimeshkumar D. Patel
*Assistant Examiner*—Anne M Hines
(74) *Attorney, Agent, or Firm*—McDermott Will & Emery LLP

(57) ABSTRACT

A display filter capable of enhancing the visible light transmittance and contrast ratio for a bright room condition and a display device including the same. The display filter includes a filter base, and an external light-shielding layer, disposed on a surface of the filter base, including a matrix made of a transparent resin and a plurality of wedge-shaped black stripes arranged parallel to each other at a surface of the matrix.

22 Claims, 12 Drawing Sheets

FOREIGN PATENT DOCUMENTS

| | | |
|---|---|---|
| JP | 2004062084 | 2/2004 |
| JP | 2004258380 | 9/2004 |
| JP | 2004-286996 | 10/2004 |
| JP | 2004286996 | 10/2004 |
| JP | 2005-338270 | 12/2005 |
| JP | 2006-145611 | 6/2006 |
| KR | 100238914 | 10/1999 |
| WO | WO 2004083955 A1 * | 9/2004 |

* cited by examiner

DISPLAY FILTER AND DISPLAY DEVICE INCLUDING THE SAME

This application claims priority from Korean Patent Application Nos. 10-2005-0000473 and 10-2005-0108198 filed on Jan. 4, 2005 and Nov. 11, 2005, respectively, in the Korean Intellectual Property Office, the disclosure of which are incorporated herein by references in their entireties.

BACKGROUND OF THE INVENTION

1. Field of the Invention

The present invention relates to a display filter and a display device including the same. More particularly, the present invention relates to a display filter including an external light-shielding layer with wedge-shaped black stripes which can enhance the visible light transmittance and contrast ratio for a bright room condition, and a display device including the display filter.

2. Description of the Related Art

As modern society becomes more information oriented, the technology of image display devices and apparatuses is advancing, and these devices are becoming widespread. In particular, image display devices are in widespread use in devices such as TV screens and PC monitors. Thinly built wide screens have become mainstream display devices.

In particular, plasma display panels (PDP) are gaining popularity as next-generation display devices to replace cathode ray tubes (CRTs) because PDPs are thin, have a large screen, and can be readily fabricated. A PDP device displays images based on a gas discharge phenomenon, and exhibits superior display characteristics, e.g., a high display capacity, high luminance and contrast, free from afterimage, and a wide viewing angle.

In a PDP device, when a direct current (DC) or alternating current (AC) voltage is applied to electrodes, a gas plasma discharge occurs that produces ultraviolet (UV) light. The UV emission excites adjacent phosphors to emit visible light.

Despite the above advantages, PDPs have several challenges associated with driving characteristics, including an increase in electromagnetic (EM) radiation, near-infrared (NIR) emission, phosphor surface reflection, and an obscured color purity due to orange light emitted from neon (Ne), helium (He) or xenon (Xe) that is used as a sealing gas.

The electromagnetic (EM) radiation generated by PDPs may adversely affect humans and cause electronic devices, such as wireless telephones or remote controls to malfunction. Thus, to use such PDPs, there is a need to reduce the EM radiation emitted from the PDPs to a predetermined level or less, e.g., by shielding. Various PDP filters have been used for such shielding, and to reduce unwanted reflections and to enhance color purity. For example, various PDP filters having an EM shielding function and a NIR wave shielding function.

Conventional PDP filters cannot, however, prevent external light from entering a panel assembly in a bright room condition. The external light that entered the panel assembly may undergo interference with light emitted from a discharge cell in the panel assembly, thereby lowering the contrast ratio of a panel operating in a bright room condition, ultimately degrading the image display capability of the PDP.

SUMMARY OF THE INVENTION

The present invention provides a display filter with an improved structure by which the luminance and contrast ratio of a display device for a bright room condition can be enhanced.

The present invention also provides a display device including the display filter.

According to an aspect of the present invention, there is provided a display filter including a filter base, and an external light-shielding layer disposed on a surface of the filter base and having a matrix made of a transparent resin and a plurality of wedge-shaped black stripes arranged parallel to each other at a surface of the matrix.

According to another aspect of the present invention, there is provided a display device including a panel assembly having a transparent front substrate and a rear substrate disposed to face each other, and a plurality of cells between the front substrate and the rear substrate, and a display filter facing the front substrate of the panel assembly and having a filter base, and an external light-shielding layer disposed on a surface of the filter base and having a matrix made of a transparent resin and a plurality of wedge-shaped black stripes arranged parallel to each other at a surface of the matrix.

According to still another aspect of the present invention, there is provided a display device including a panel assembly having a transparent front substrate and a rear substrate disposed to face each other and a plurality of cells between the front substrate and the rear substrate, an external light-shielding layer disposed on a surface of the panel assembly and having a matrix made of a transparent resin and a plurality of wedge-shaped black stripes arranged parallel to each other at a surface of the matrix, and a display filter facing the external light-shielding layer and having an antireflection (AR)-shielding function and/or an EM radiation-shielding function, a near-infrared ray (NIR) wave-shielding function, or a combination thereof.

BRIEF DESCRIPTION OF THE DRAWINGS

The above and other features and advantages of the present invention will become more apparent from the following detailed exemplary embodiments and reference to the attached drawings in which.

DETAILED DESCRIPTION OF THE INVENTION

Figure 1:
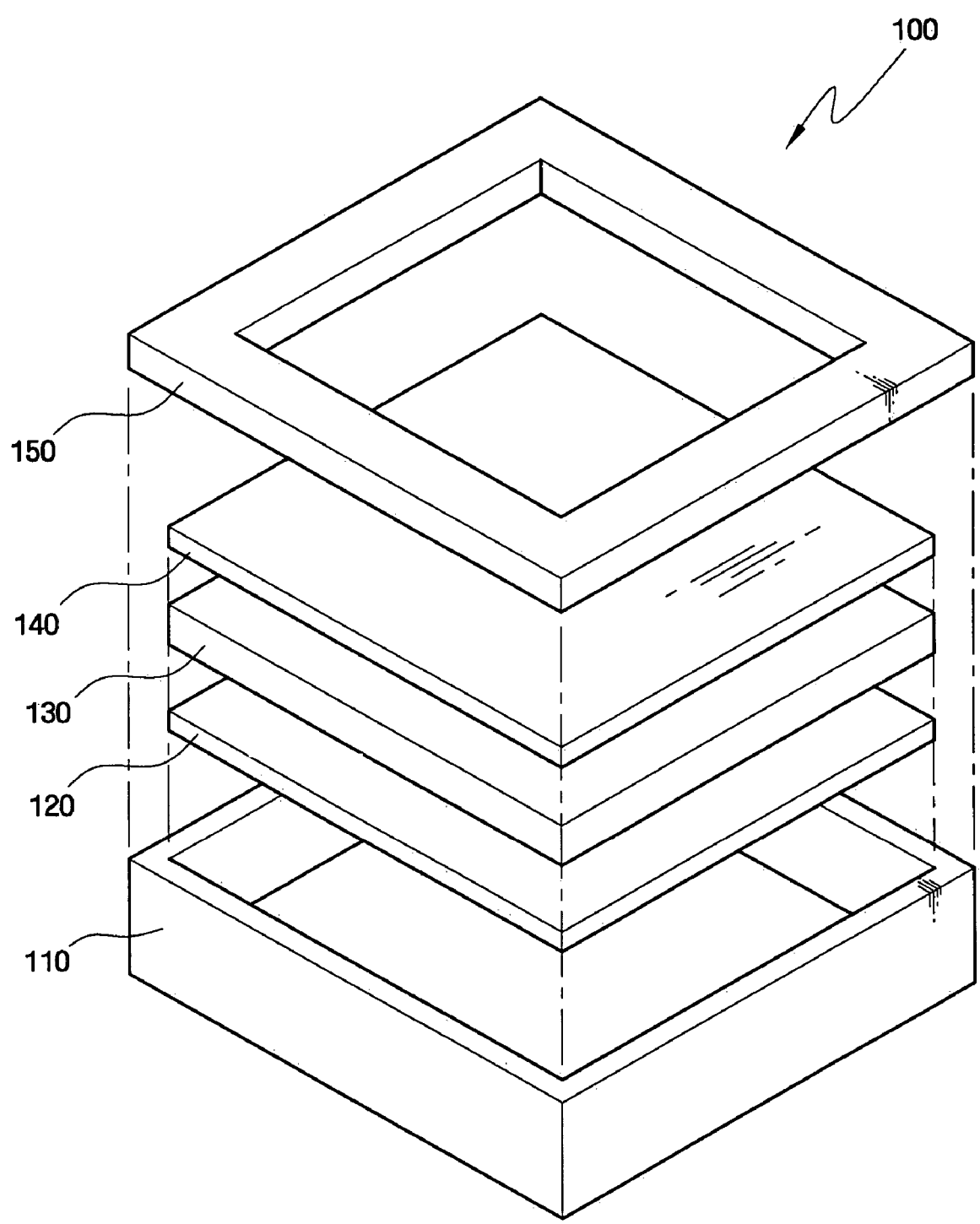
FIG. 1 is an exploded perspective view illustrating a plasma display panel (PDP) according to an embodiment of the present invention.

Advantages and features of the present invention and methods of accomplishing the same may be understood more readily by reference to the following detailed description of preferred embodiments and the accompanying drawings. The present invention may, however, be embodied in many different forms and the detailed description of certain embodiments should not be construed as limiting the invention to those embodiments; rather, these embodiments are provided so that this disclosure will convey the concept of the invention to those skilled in the art. The present invention is defined by the appended claims. Like reference numerals refer to like elements throughout the specification.

The present invention can be applied to a wide variety of displays including large-size displays such as plasma display panels (PDPs) realizing an RGB color display using matrix pattern pixels, organic light emitting diode displays (OLEDs), liquid crystal displays (LCDs), or field emission displays (FEDs), small-size displays such as personal digital assistants PDAs, small game device display windows or mobile phone display windows, flexible displays, and so on. In particular, the present invention can be effectively used for both displays installed in public facilities for indoor applications and displays for outdoor applications having high external light. While a PDP and a PDP filter will be illustrated hereinafter by way of example, it will be understood by one skilled in the art that the present invention can also be applied to other displays and filters as well, including those referenced above.

FIG. 1 is an exploded perspective view illustrating a plasma display panel (PDP) 100 according to an embodiment of the present invention. Referring to FIG. 1, the PDP 100 includes a case 110, a cover 150 covering an upper surface of the case 110, a driving circuit board 120 received in the case 110, a panel assembly 130 including discharge cells (not shown) in which a gas discharge occurs, and a PDP filter 140. The PDP filter 140 includes a conductive layer (not shown) made of a material with good conductivity on a transparent substrate (not shown). The conductive layer is grounded to the case 110 via the cover 150; that is, EM radiation generated from the panel assembly 130, before it reaches a viewer, is grounded to the cover 150 and the case 110 through the conductive layer of the PDP filter 140.

Hereinafter, the PDP filter 140 which provides shielding of EM radiation, NIR emission, external light, etc., will first be described, and a PDP including the PDP filter 140 and the panel assembly 130 will then be described.

Figure 2:
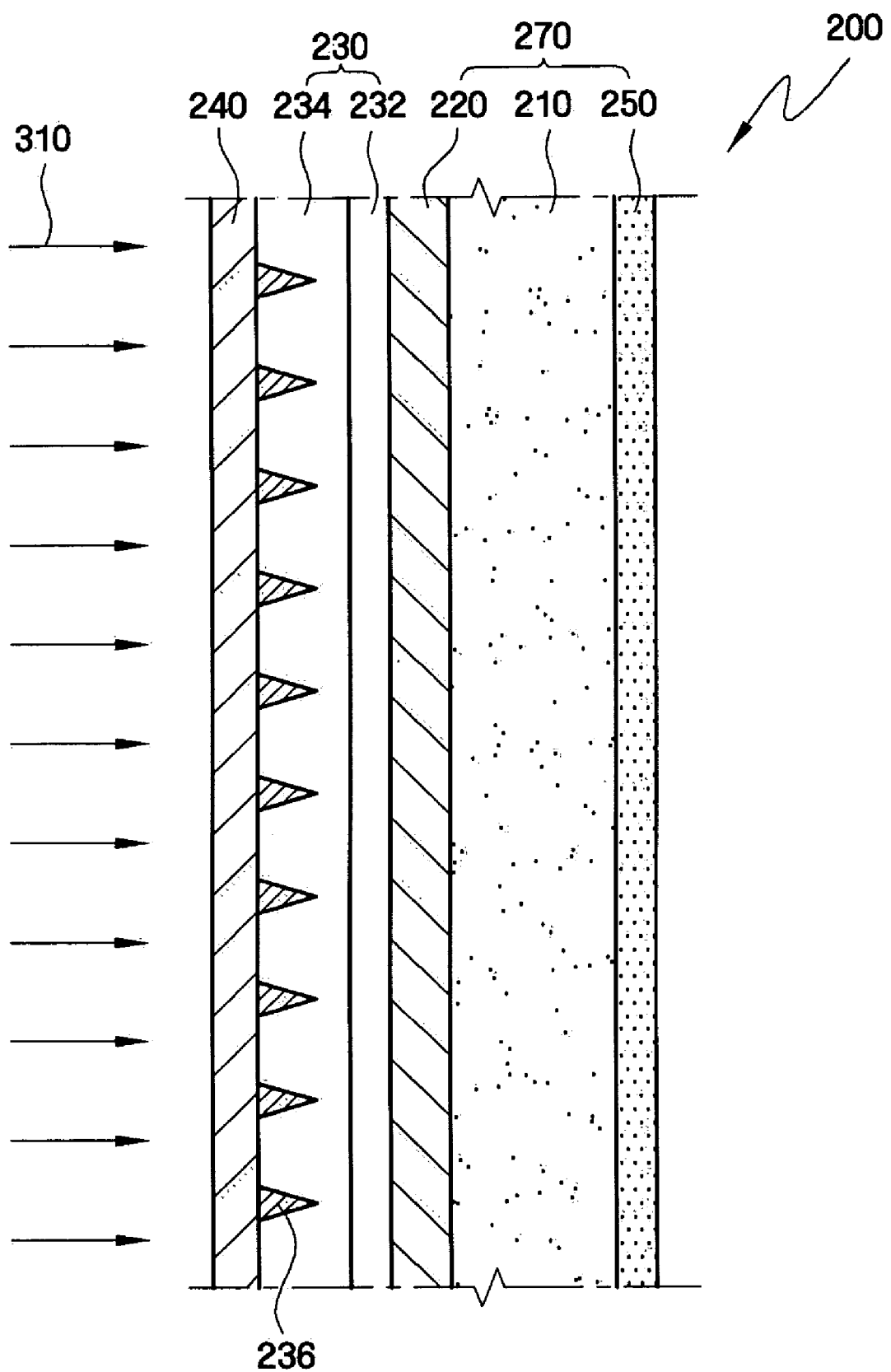
FIG. 2 is a sectional view illustrating a PDP filter according to an embodiment of the present invention.

FIG. 2 is a sectional view illustrating a PDP filter 200 according to an embodiment of the present invention. Referring to FIG. 2, the PDP filter 200 includes a filter base 270 including a transparent substrate 210 and various functional layers disposed on the transparent substrate 210, and an external light-shielding layer 230.

Here, the filter base 270 includes the transparent substrate 210, an antireflective layer 250 disposed on a surface of the transparent substrate 210, and an EM radiation-shielding layer 220 disposed on the other surface of the transparent substrate 210. The stacking sequence of the transparent substrate 210, the antireflective layer 250, and the EM radiation-shielding layer 220, however, may vary. While the current embodiment of the present invention has illustrated that an EM radiation-shielding layer and an antireflective layer are separately formed, the present invention is not limited thereto; that is, the filter base 270 may be comprised of one or more layers, and each layer may have an EM radiation-shielding function, an antireflection (AR) function, or a combination thereof.

The filter base 270 may have both an EM radiation-shielding function and an antireflection (AR) function as described above, but it may also have only one of an EM radiation-shielding function and an antireflection (AR) function.

The external light-shielding layer 230 is disposed on one surface of the filter base 270. According to the embodiment shown in FIG. 2, the external light-shielding layer 230 is disposed on a surface of the filter base 270 facing the panel assembly 130; that is, on a side opposite to the viewer when the PDP filter 200 is installed in a PDP (not shown). Alternatively, the external light-shielding layer 230 may also be disposed on the other surface of the filter base 270. In this case, the similar functions and effects can be realized where the external light-shielding layer 230 is disposed on one surface or the other surface of the filter base 270.

The external light-shielding layer 230 includes a support 232, a matrix 234 disposed on a surface of the support 232, and a plurality of wedge-shaped black stripes 236, disposed in the matrix 234, reducing entrance of external light into the panel assembly.

Here, the matrix 234 with the black stripes 236 may be directly disposed on the filter base 270. As shown in FIG. 2, however, the matrix 234 may also be disposed on the filter base 270 via the support 232. The support 232 supports the matrix 234 with the black stripes 236. While the embodiment of FIG. 2 has illustrated that the matrix 234 is attached to a surface of the filter base 270 via the support 232, the present invention is not limited thereto, and considering that the support 232 is used to support the matrix 234, the matrix 234 may also be directly attached to the filter base 270 when the external light-shielding layer 230 is disposed on the other surface of the filter base 270.

According to an embodiment of the present invention, the support 232 may be a transparent resin film that is transparent to UV light, e.g., polyethylene terephthalate (PET), polycarbonate (PC), or polyvinylchloride (PVC). Alternatively, the support 232 may be a layer having an intrinsic filter characteristic, such as the antireflective layer 250, or the EM radiation-shielding layer 220.

The black stripes 236 have wedge-shaped profiles, and are arranged parallel to each other at one surface of the matrix 234 facing a panel assembly (not shown) to reduce external light from coming into the panel assembly.

The matrix 234 may be made of a UV-curable resin, and the black stripes 236 may be made of a light-absorbing material such as a black inorganic material and/or organic material or a metal. In particular, in the case of using a metal with high electric conductivity, i.e., low electric resistance, the black stripes 236 may include metal powder. In this case, because electric resistance can be controlled by adjusting a concentration of the metal powder, the black stripes 236 having an EM radiation-shielding function can be obtained. Furthermore, in the case of using a surface-blackened metal or a black metal, the black stripes 236 can efficiently realize external light- and EM radiation-shielding effects. The black stripes 236 may also be made of a carbon-containing UV-curable resin. A method of forming the black stripes 236 in the matrix 234 will next be described.

To form the black stripes 236 in the matrix 234, a UV-curable resin is coated on a surface of the support 232. Next, the support 232 is allowed to pass through a black stripe forming roll (not shown) having a surface shape corresponding to the wedge-shaped black stripes 236 so that the shape of the black stripe forming roll is transferred to a surface of the matrix 234. Then, the matrix 234 is cured by UV light exposure to form the matrix 234 with wedge-shaped grooves. A carbon-containing UV-curable resin is deposited in the wedge-shaped grooves of the matrix 234, followed by UV curing, to complete the black stripes 236 configured entirely wedgewise.

The formation method of the black stripes 236 in the present invention does not need to be particularly restricted as described above, but may also be accomplished by a thermal pressing method in which a thermoplastic resin is used, or an extrusion molding method in which a thermoplastic or thermocurable resin is filled into the matrix 234 having patterns opposite to the black stripes 236 transferred thereto and then molded. Additionally, when the UV-curable resin forming the matrix 234 has an antireflection (AR) shielding function, an EM radiation-shielding function, a color-adjusting function, or a combination thereof, the external light-shielding layer 230 may also perform these functions.

The external light-shielding layer 230 shown in FIG. 2 will now be described in more detail with reference to FIGS. 3 through 5.

Figure 3:
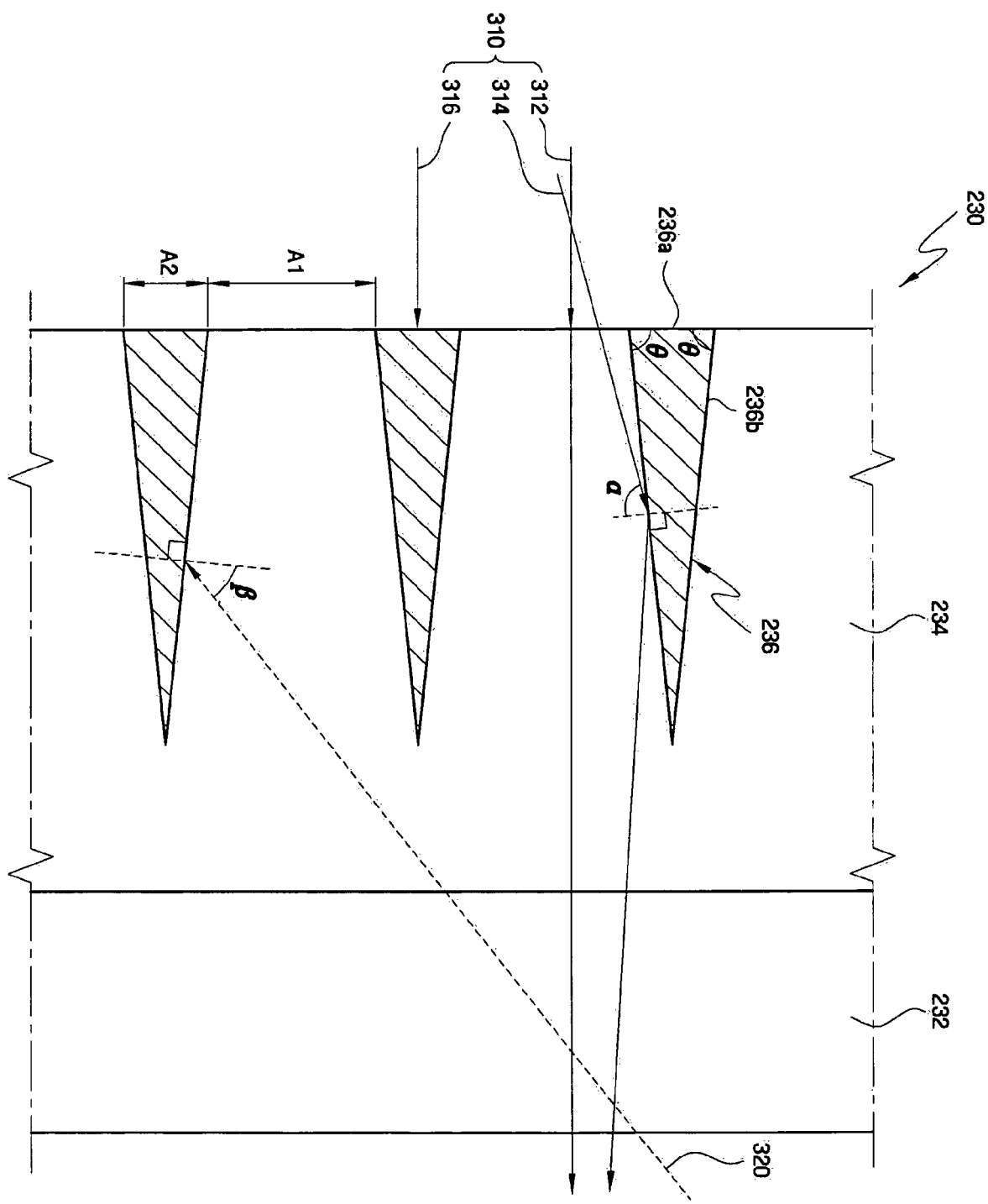
FIG. 3 is an enlarged sectional view of an external light-shielding layer shown in FIG. 2.

FIG. 3 is an enlarged sectional view of an external light-shielding layer shown in FIG. 2. As shown, the external light-shielding layer 230 includes the support 232, the matrix 234 disposed on a surface of the support 232, and the plurality of wedge-shaped black stripes 236 arranged parallel to each other at a surface of the matrix 234. The black stripes 236 include bottom portions 236a exposed on one surface of the matrix 234 and inclined surfaces 236b extending from the bottom portions 236a and defining a wedge-shaped groove in the matrix 234. The inclined surfaces 236b absorb external light 320 and totally reflect incident light 310 from a panel assembly toward a viewer.

As will later be described in greater detail, according to the profile shapes of the black stripes 236 shown in FIG. 3, the inclined surfaces 236b are much longer than the bottom portions 236a; that is, the visible light transmittance and contrast ratio of the PDP filter 200 are determined by the shape and material of the black stripes 236 regardless of whether the bottom portions 236a of the black stripes 236 face a panel assembly or a viewer. Thus, the PDP filter 200 can have a higher visible light transmittance and contrast ratio than a conventional PDP filter by adjusting the shape and material of the black stripes 236.

Furthermore, when the bottom portions 236a of the black stripes 236 face a panel assembly, the incidence angle of the incident light 310 from the panel assembly with respect to the inclined surfaces 236b is generally greater than that of the external light 320 with respect to the inclined surfaces 236b. Thus, the incident light 310 from the panel assembly is totally reflected from the inclined surfaces 236b, thereby increasing the transmittance of visible light, and the external light 320 is absorbed into the inclined surfaces 236b, thereby increasing contrast ratio, resulting in a PDP with better image display characteristics. Hereinafter, the present invention will be described with respect to the external light-shielding layer 230 by way of example, wherein the bottom portions 236a of the black stripes 236 face a panel assembly.

In each of the black stripes 236, an angle θ formed between the inclined surface 236b and the bottom portion 236a may be in a range of about 80 to about 89 degrees, two opposite inclined surfaces 236b defining a wedge-shaped groove in each black stripe 236 may be symmetric or asymmetric with each other within the range of the angle θ being about 80 to about 89 degrees.

The black stripes 236 are made of a light-absorbing material. Thus, as shown in FIG. 3, the external light 320 is mostly absorbed in the inclined surfaces 236b of the black stripes 236 unless it is incident vertically with respect to the external light-shielding layer 230.

Figure 4:
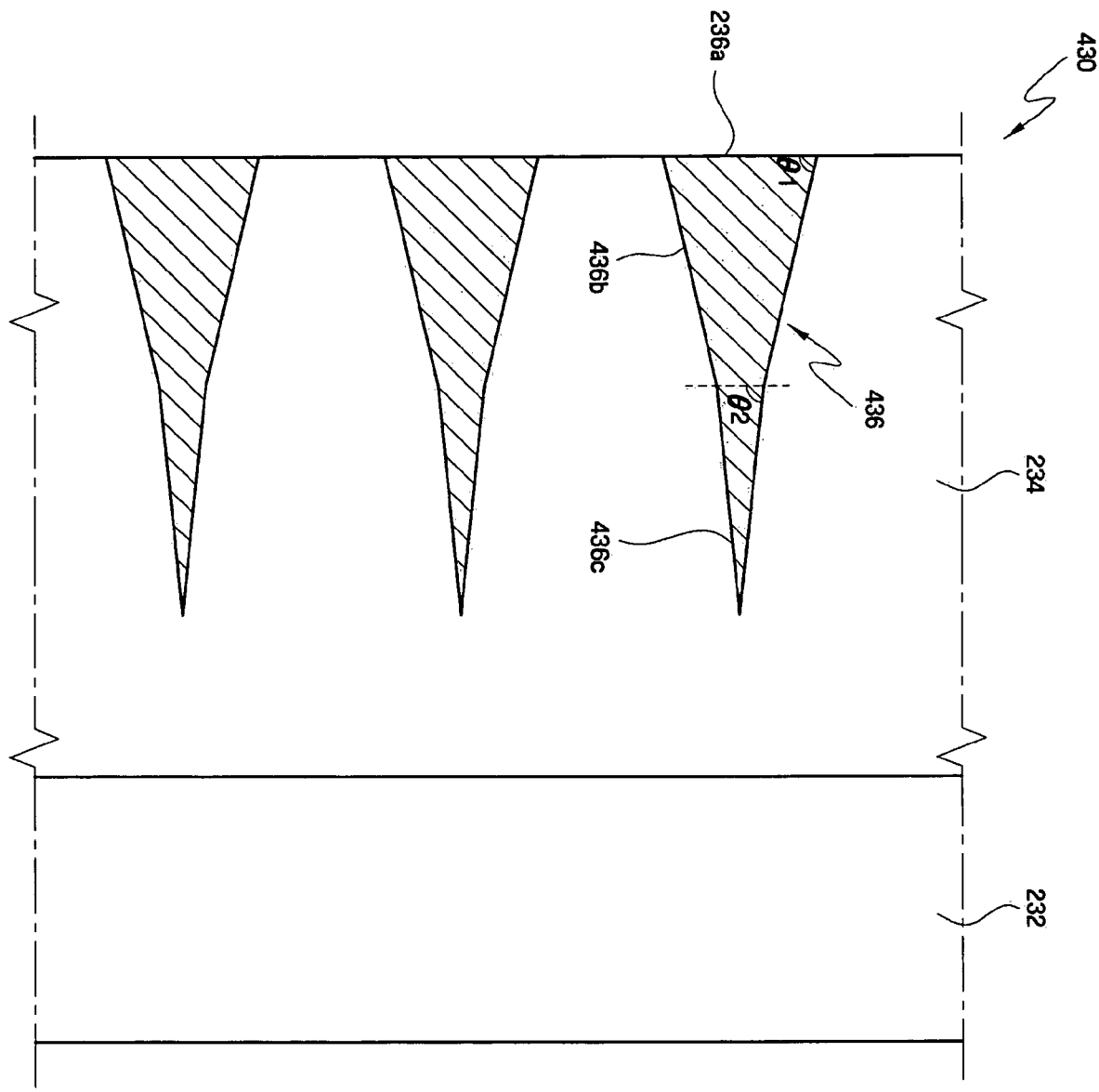
FIG. 4 is a sectional view illustrating a modified example of black stripes of the external light-shielding layer shown in FIG. 3.
Figure 5:
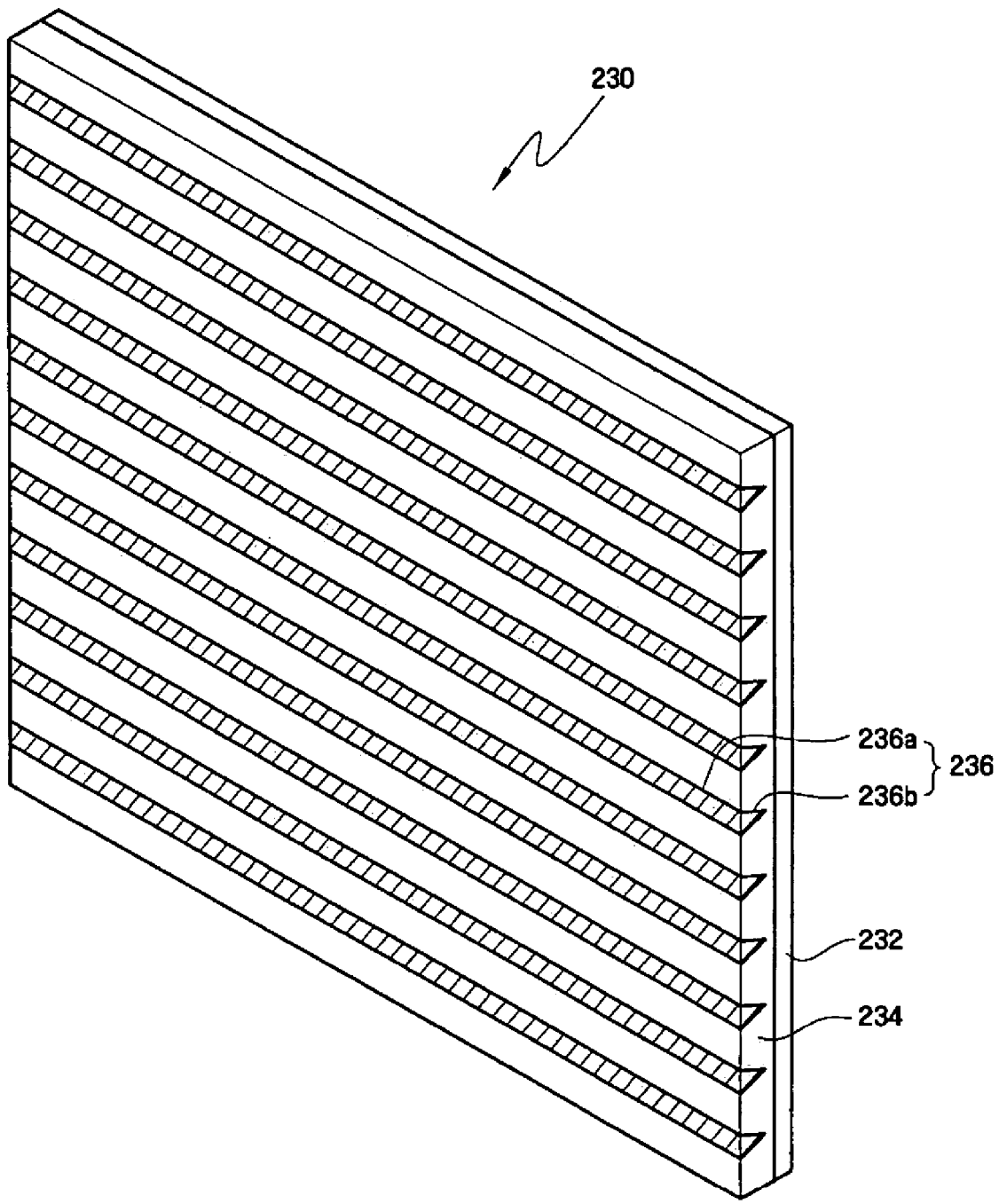
FIG. 5 is a perspective view of the external light-shielding layer shown in FIG. 3.

FIG. 4 is a sectional view illustrating a modified example of the black stripes 236 of the external light-shielding layer 230 shown in FIG. 3.

Referring to FIG. 4, black stripes 436 each includes a bottom portion 236a exposed outside a matrix 234, and first and second inclined surfaces 436b and 436c extended from the bottom portion 236a. The second and third inclined surfaces 436b and 436c are formed based on a one-time-bending design rule, thereby defining an entirely wedge-shaped groove in the matrix 234. For convenient explanation, the embodiment of FIG. 4 has illustrated that the black stripes 436 have the two inclined surfaces 436b and 436c formed based on the one-time-bending design rule. The present invention is not limited, however, to the illustrated black stripes having inclined surfaces each bent once; rather, black stripes may have inclined surfaces each bent at multiple locations.

An angle θ1 formed between the first inclined surfaces 436b and the bottom portions 236a may be smaller than an angle θ2 formed between the second inclined surfaces 436c and the bottom portions 236a. The angle θ1 formed between the first inclined surfaces 436b and the bottom portions 236a and the angle θ2 formed between the second inclined surfaces 436c and the bottom portions 236a may each be about 80 to 89 degrees.

As the angle θ1 formed between the first inclined surfaces 436b and the bottom portions 236a and the angle θ2 formed between the second inclined surfaces 436c and the bottom portions 236a are close to 90 degrees, the wedge-shaped black stripes 436 are formed to be deeper into the matrix 234, thereby ensuring more effective absorption of the external light 320. In this case, however, considering the design rule for forming the black stripes 436, each of the black stripes 436 may have two or more inclined surfaces by bending once or more, as described above. Meanwhile, the black stripes 236 and 436 shown in FIGS. 3 and 4 are sharp-ended. Alternatively, the black stripes 236 and 436 may also be blunt-ended.

Hereinafter, a PDP and a PDP filter will be described with respect to the black stripes 236 shown in FIG. 3 for convenience of illustration.

Referring again to FIGS. 2 and 3, as described above, the black stripes 236 include the bottom portions 236a exposed outside the matrix 234 and the inclined surfaces 236b extended from the bottom portions 236a and defining a wedge-shaped groove with the matrix 234. The bottom portions 236a absorb a light beam 316 of the incident light 310 from the panel assembly, and the inclined surfaces 236b totally reflect a light beam 314 of the incident light 310 from the panel assembly toward a viewer or absorb the external light 320.

First, with respect to the functions of the bottom portions 236a of the black stripes 236, the incident light 310 from discharge cells of the panel assembly is incident into the external light-shielding layer 230 nearly vertically with respect to the external light-shielding layer 230. The light beam 316 of the incident light 310 from the discharge cells of the panel assembly is absorbed in the bottom portions 236a of the black stripes 236.

Generally, a PDP is required to have a high visible light transmittance and a high contrast ratio. The contrast ratio of a PDP can be represented by Equation 1 below:

$$\text{Contrast ratio} = \frac{\text{Luminance of (white light + reflected light)}}{\text{Luminance of (black light + reflected light)}} \quad (1)$$

When all light beams emitted from a panel assembly are allowed to pass through a PDP filter to increase the transmittance of a PDP, the luminance of black light and the luminance of white light are increased. Thus, when the luminance of a PDP is increased, the contrast ratio is relatively decreased. A conventional PDP uses a PDP filter including a black colorant-containing color correction film to increase the contrast ratio with a sacrifice of a reduction in the transmittance of the PDP filter. To obtain a contrast ratio of 120:1 using such a conventional PDP, a visible light transmittance must be reduced to about 40%. The PDP filter 200 according to the present invention uses the black stripes 236 absorbing light, instead of using a color correction film including a black colorant. Here, the bottom portions 236a of the black stripes 236 control the transmittance of visible light emitted from a panel assembly by partially absorbing the incident light 310 from the panel assembly, to thereby increase the contrast ratio of a PDP. When the ratio of the area of the bottom portions 236a of the black stripes 236 to the area of a surface of the matrix 234, i.e., A2/(A1+A2) is 20~50%, a minimum transmittance loss and a maximum contrast ratio can be achieved. When A2/(A1+A2) is 25~35%, more advantageous effects can be obtained. A PDP using the PDP filter 200 including the above-described external light-shielding layer 230 can achieve a contrast ratio of 250:1 or more while maintaining a visible light transmittance of 50% or greater.

Meanwhile, the external light-shielding layer 230 has a visible light transmittance of 70% or greater. The incident light 310 from the panel assembly is incident into the external light-shielding layer 230 nearly vertically with respect to the external light-shielding layer 230. Among the incident light 310 from the panel assembly, the light beam 316 is absorbed in the bottom portions 236a as described above, and a light beam 312 directly passes through the matrix 234. The light beam 314 is totally reflected on the inclined surfaces 236b of the black stripes 236 toward a viewer, thereby increasing the transmittance of the PDP.

As used herein, the term "total reflection" indicates the phenomenon that when light travels from an optically dense medium (higher refractive index medium) to an optically sparse medium (lower refractive index medium) at an incidence angle above a predetermined angle (critical angle), all of the incident light is reflected at the interface between the sparse medium and the dense medium. Although the black stripes 236 are made of a light-absorbing material, the use of the black stripes 236 having a lower refractive index than the matrix 234 enables the total reflection of the incident light 310 from the panel assembly, thereby increasing the transmittance of the PDP.

In an embodiment of the present invention, the refractive index difference between the matrix 234 and the black stripes 236 may be 0.05 or less. For example, when the refractive index of the matrix 234 is 1.56 and the refractive index of the black stripes 236 is 1.55, total reflection occurs at the critical angle of about 83.51 degrees (e.g., the arcsin (1.55/1.56)). When the refractive index of the matrix 234 is 1.56 and the refractive index of the black stripes 236 is 1.51, total reflection occurs at the critical angle of about 75.45 degrees (=arcsin (1.51/1.56)). Thus, when the incidence angle α of the light beam 314 with respect to the inclined surfaces 236b is about 75.45 degrees or greater, the light beam 314 is totally reflected from the inclined surfaces 236b toward a viewer, thereby increasing the transmittance of the PDP filter 200.

If the refractive index difference between the matrix 234 and the black stripes 236 is greater than 0.05, a critical angle for total reflection may decrease and, therefore, the external light 320 may be incident into the panel assembly due to the total reflection on the inclined surfaces 236b, thereby decreasing a contrast ratio. Thus, as shown in FIG. 3, a light source such as a fluorescent lamp and sunlight emitting the external light 320 is generally positioned at a higher level than a PDP. Therefore, the incidence angle β of the external light 320 with respect to the inclined surfaces 236b is much smaller than 90 degrees.

If the refractive index difference between the matrix 234 and the black stripes 236 is greater than 0.05, a critical angle for total reflection may decrease and thus, the external light 320 may be totally reflected from the black stripes 236 due to its smaller incidence angle and enter into a panel assembly. According to Equation 1, the contrast ratio is a function of the luminance of reflected light. Here, the term "reflected light" refers to the reflected light beam of the external light 320 which has entered into a panel assembly. If the external light 320 is totally reflected from the black stripes 320 into a panel assembly and then reflected from the panel assembly, the luminance of reflected light will increase. At this time, even if black light and white light produce the same reflected light, the contrast ratio is rapidly reduced due to the "luminance of reflected light" placed in the denominator of Equation 1.

When the PDP filter 200 according to the present invention is installed in a PDP, the PDP can show a high transmittance and contrast ratio due to the above-described shapes of the black stripes, 236 regardless of the arrangement of the black stripes 236. Furthermore, as described above, since a light source such as a fluorescent lamp or sunlight emitting the external light 320 is generally positioned at a higher level than a PDP and the black stripes 236 are arranged in a transverse direction with respect to a viewer (see FIG. 5), the black stripes 236 can more efficiently absorb the external light 320. FIG. 5 is a perspective view of the external light-shielding layer 230 shown in FIG. 3.

Hereinafter, the filter base 270 shown in FIG. 2 will be described in detail.

Turning to FIG. 2, the filter base 270 includes the EM radiation-shielding layer 220 disposed on a surface of the transparent substrate 210 and the antireflective layer 250 disposed on the other surface of the transparent substrate 210. The present invention is not limited, however, to the above-illustrated stacked structure, and the stacking sequence of the transparent substrate 210, the antireflective layer 250, and the EM radiation-shielding layer 220 may be diversely modified.

The transparent substrate 210 is generally formed to a thickness of about 2.0 to 3.5 mm using a tempered or semi-tempered glass, or a transparent plastic material such as acryl. Glass has a specific gravity of 2.6 and therefore, increases the weight and thickness of a PDP filter. Thus, when a glass substrate for a PDP filter is installed in a PDP panel, the total weight of the PDP panel increases. The glass substrate, however, guarantees the high level of safety against fracture. The transparent substrate 210 may be omitted according to the specification of the filter base 270.

The transparent substrate 210 may be made of an inorganic compound such as glass or quartz, or a transparent organic polymer.

Examples of the transparent organic polymer include acryl and polycarbonate, but the present invention is not limited to the above-illustrated examples. The transparent substrate 210 may have high transparency and heat resistance. A polymer structure or a stacked polymer structure can be used as the transparent substrate 210. The transparent substrate 210 may have a high transparency of visible light transmittance of 80% or greater, and a good heat resistance of a glass transition temperature of 50° C. or higher. The polymer foam material may be any transparent material in the visible wavelength range and specific examples thereof include, but are not limited to, polyethylene terephthalate(PET), polysulfone (PS), polyether sulfone (PES), polystyrene, polyethylene naphthalate, polyarylate, polyether etherketone (PEEK), polycarbonate (PC), polypropylene(PP), polyimide, triacetylcellulose (TAC), and polymethylmethacrylate (PMMA). PET is more preferred in view of price, heat resistance, and transparency.

To shield an EM radiation, it is necessary to cover a surface of a display with a highly conductive structure. Thus, the EM radiation-shielding layer 220 may be a multilayered transparent conductive film obtained by stacking a conductive mesh film or a metal film and a higher refractive index transparent film. The embodiment of FIG. 2 illustrates that the EM radiation-shielding layer 220 is disposed on the surface of the transparent substrate 210 facing a panel assembly, but the present invention is not limited thereto.

Here, the conductive mesh film may be a grounded metal mesh film, or a metal-coated, synthetic resin or metal fiber mesh film. Examples of the useful conductive mesh film include any metallic material having good electric conductivity and workability such as copper, chromium, nickel, silver, molybdenum, tungsten, or aluminum. Specifically, Cu and Ni are more preferred in view of electric conductivity and workability. The conductive mesh film may be formed by patterning a metal laminate film using photoetching or by metal plating. The conductive mesh may have a thickness of 1 to 20 μm, and more preferably, 3 to 10 μm. If the thickness of the conductive mesh film is less than 1 μm EM radiation-shielding capability may be lowered. On the other hand, if it exceeds 20 μm a film formation time may be increased. Generally, the sheet resistance of a substrate having thereon a metal mesh is 0.5 Ω/sq or less.

The higher refractive index transparent film of the multilayered transparent conductive film may be made of indium tin oxide (ITO) to shield an EM radiation. The multilayered transparent conductive film may be an alternately stacked structure of a metal film made of gold, silver, copper, platinum, or palladium, and a higher refractive index transparent film made of indium oxide, stannic oxide, or zinc oxide. The metal film of the multilayered transparent conductive film has high conductivity and good shielding capability for NIR over a broad wavelength range by the reflection or absorption of NIR, but has a relatively low visible light transmittance. The higher refractive index transparent film of the multilayered transparent conductive film has relatively low conductivity and NIR-shielding capability than the metal film but good transparency. Thus, the multilayered transparent conductive film comprised of the metal film and the higher refractive index transparent film shows high conductivity, good NIR-shielding function, and high visible light transmittance by the combination of the advantages of the metal film and the advantages of the higher refractive index transparent film.

Here, EM radiation-shielding is achieved by the reflection or absorption of EM radiation by the EM radiation-shielding layer 220. For absorption of EM radiation, a conductive metal film may be used as the EM radiation-shielding layer 220. Further, to absorb all of the EM radiation generated from a display, the conductive metal film must have a thickness above a predetermined level. As the thickness of the conductive metal film increases, however, visible light transmittance decreases. In this regard, the use of the above-illustrated multilayered transparent conductive film obtained by alternately stacking the metal film and the higher refractive index transparent film ensures more reflection interfaces, thereby increasing the reflection of EM radiation.

The metal film of the multilayered transparent conductive film may be made of silver (Ag) or silver alloy. Silver offers good conductivity, infrared ray reflection, and visible light transmittance in a stacked structure; silver is unstable chemically and physically and is easily degraded by an environmental factor such as contaminants, water vapor, heat, or light. Thus, a silver alloy containing at least one stable metal selected from gold, platinum, palladium, copper, indium, and tin may be used. Generally, silver in combination with other metal is degraded in terms of conductivity and optical characteristics. Therefore, at least one of a plurality of metal films constituting a multilayered transparent conductive film may be made of only silver. If all metal films are made of silver, the EM radiation-shielding layer 220 can have good conductivity and optical characteristics, but may be easily degraded by an environmental factor. The metal film may be formed using any method known commonly in the art such as sputtering, ion-plating, vacuum deposition, or plating.

The higher refractive index transparent film of the multilayered transparent conductive film permits the transmission of visible light and prevents the reflection of visible light by a refractive index difference between it and the metal film. For example, the higher refractive index transparent film may be made of oxide of metal such as indium, titanium, zirconium, bismuth, tin, zinc, antimony, tantalum, cerium, neodium, lanthanum, thorium, magnesium, potassium, or a combination thereof, or zinc sulfide. In the metal oxide or sulfide, the stoichiometric composition of metal to oxygen or sulfur can be changed, provided that the optical characteristics of the EM radiation-shielding layer 220 are not significantly affected. Indium oxide or a combination (ITO) of indium oxide and tin oxide is preferable due to good transparency, high refractive index, rapid film growth rate, and good adhesion to the metal film. Also, the use of a highly conductive oxide semiconductor layer such as an ITO layer can increase the EM radiation absorptivity and conductivity of the EM radiation-shielding layer 220. The higher refractive index transparent film may be formed using any method known commonly in the art such as sputtering, ion-plating, ion-beam assist, vapor deposition, or wet coating.

Among various film growth methods, sputtering is advantageous in terms of film thickness control and film stacking. The metal film and the higher refractive index transparent film constituting the multilayered transparent conductive film can be grown in an easy, repeated, and continuous manner using sputtering. According to an embodiment of the present invention, the EM radiation-shielding layer 220 may be formed by continuous sputtering of a higher refractive index transparent film made of indium oxide and a metal film made of silver or its alloy. The higher refractive index transparent film made of indium oxide may be formed by reactive sputtering using a metal target containing indium as a main component or a sintered target containing indium oxide as a main component, and the metal film made of silver or its alloy may be formed by sputtering using a silver or silver-containing alloy target.

Although not shown, the filter base 270 may further include a NIR-shielding layer. The NIR-shielding layer serves to shield strong NIR radiation from a panel assembly that may cause a malfunction of electronic machines such as wireless telephones or remote controllers.

The multi-layered transparent conductive film used as the EM radiation-shielding layer 220 also has a NIR-shielding effect. Thus, both NIR and EM radiation can be shielded by only the EM radiation-shielding layer 220 with no separate NIR-shielding layer. Of course, in this case, a NIR-shielding layer can be formed separately.

A conductive mesh film may also be used as the EM radiation-shielding layer 220. In this case, a polymer resin containing a NIR-absorbing colorant capable of absorbing NIR wavelengths may be used to shield NIR radiation from a panel assembly. For example, the NIR-absorbing colorant may be an organic colorant selected from cyanines, anthraquinones, naphthoquinones, phthalocyanines, naphthalocyanines, diimoniums, and nickel dithiol complexes. Generally, a PDP generates strong NIR over a broad wavelength range and, therefore, need to use a NIR-shielding layer capable of absorbing NIR over a broad wavelength range.

A transparent conductive film may also be used as the EM radiation-shielding layer 220. The transparent conductive film may show a lower EM radiation-shielding function than the above-described conductive mesh film, but the EM radiation-shielding function can be supplemented or reinforced by the addition of metal powder to the black stripes 236. Thus, the transparent conductive film can also perform a sufficient EM radiation-shielding function.

In the embodiment of FIG. 2, the antireflective layer 250 is disposed on the opposite surface of the transparent substrate 210 to the EM radiation-shielding layer 220. The present invention is not limited, however, to the above-illustrated stacking sequence of the EM radiation-shielding layer 220, the transparent substrate 210, and the antireflective layer 250. Preferably, as shown in FIG. 2, the antireflective layer 250 is formed at the viewer's side of a PDP including the PDP filter 200, i.e., at an opposite side to a panel assembly. The antireflective layer 250 reduces the reflection of external light to improve visibility.

The antireflective layer 250 may also be further formed at a panel assembly side of the PDP filter 200 to more efficiently reduce the reflection of external light. The reduction of the reflection of external light by the antireflective layer 250 can enhance the transmittance of visible light emitted from a panel assembly and increase a contrast ratio. The antireflective layer 250 may be formed by coating or printing an antireflective film on a substrate or by various commonly known film formation methods. Alternatively, the antireflective layer 250 may also be formed by attaching a transparent structure including an antireflective film or an antireflective transparent structure to a predetermined position by means of a transparent adhesive or bond.

For example, the antireflective layer 250 may be a ¼ wavelength monolayered film made of a material having a low refractive index in visible light region of 1.5 or less, preferably 1.4 or less, for example, a fluorine-based transparent polymer resin, magnesium fluoride, a silicon-based resin, or silicon oxide. The antireflective layer 250 may also be a multilayered film made of two or more materials with different refractive indices selected from an inorganic compound such as metal oxide, fluoride, silicide, boride, carbide, nitride, or sulfide, and an organic compound such as silicon-based resin, acrylic resin, and fluorine-based resin.

The antireflective layer 250 formed as a monolayered film is easy to manufacture but exhibits an insufficient antireflection (AR) effect relative to that formed as a multilayered film. The antireflective layer 250 formed as a multilayered film exhibits an antireflection (AR) effect over a broad wavelength range. An inorganic compound film for the antireflective layer 250 may be formed by a method known commonly in the art, such as sputtering, ion-plating, ion-beam assist, vapor deposition, or wet coating, and an organic compound film for the antireflective layer 250 may be formed by a method commonly known in the art, such as wet coating.

For example, the antireflective layer 250 may also be an alternately stacked structure of a lower refractive index oxide film made of, for example, $SiO_2$, and a higher refractive index oxide film made of for example $TiO_2$ or $Nb_2O_5$. These oxide films can be formed using physical vapor deposition or wet coating.

The PDP filter 200 may further include a color correction layer 240 having a transmittance of 60% or greater at a wavelength range of 580 to 600 nm. The color correction layer 240 changes or corrects a color balance by reducing or adjusting the intensities of red (R), green (G), and blue (B).

Generally, red visible light emitted from plasma in a panel assembly appears as orange light. A conventional color correction layer performs color correction from orange having a wavelength range of 580 to 600 nm to red. The color correction layer 240 has a transmittance of 60% or greater for orange color having a wavelength range of 580 to 600 nm, however, and thus, can reduce or exclude color correction from orange to red.

The reason for strong orange light radiation from a panel assembly is because light emitted from plasma and reflected light beam of external light transmitted through a panel assembly appear as an orange color. In the PDP filter 200 of the present invention, the external light-shielding layer 230 prevents the entrance of the external light 320 into a panel assembly, resulting in a fundamental reduction of orange light radiation. Thus, the PDP filter 200 can enhance color purity with no or less use of a colorant for orange color correction. For example, when color coordinates were measured using RGB colors at a bright room (150 lux) for the middle of the IRE scale (50 IRE), the ratio of the area of the measured color coordinates to the area of intrinsic color coordinates at a panel assembly with no the PDP filter 200 was 66%, whereas that at a panel assembly with the PDP filter 200 was 86%. This reveals that the PDP filter 200 of the present invention provides high color purity.

The color correction layer 240 uses various colorants to increase the color reproduction range of a display and to enhance screen sharpness. The colorant may be a dye or a pigment. The colorant may be an organic colorant having a neon light-shielding function such as anthraquinone, cyanine, azos, stilbene, phthalocyanine, and methine, but the present invention is not limited thereto. The type and concentration of the colorant are not particularly defined herein since they are determined by an absorption wavelength, an absorption coefficient, and transmission characteristics required by a particular display.

The layers or films constituting the PDP filter 200 can be attached to each other by a transparent adhesive or bond. Specific examples of the adhesive agents include acryl, silicone, polyvinylbutyral, ethylenevinylacetate, polyvinylether, saturated amorphous polyester, melamine resin, and the like.

The thus-formed PDP filter 200 has a visible light transmittance of 50% or greater and a contrast ratio of 250:1 or more in a bright room.

Hitherto, the PDP filter 200 has been illustrated; hereinafter, a PDP including the PDP filter 200 will be described with reference to FIGS. 6A and 6B.

Figure 6A:
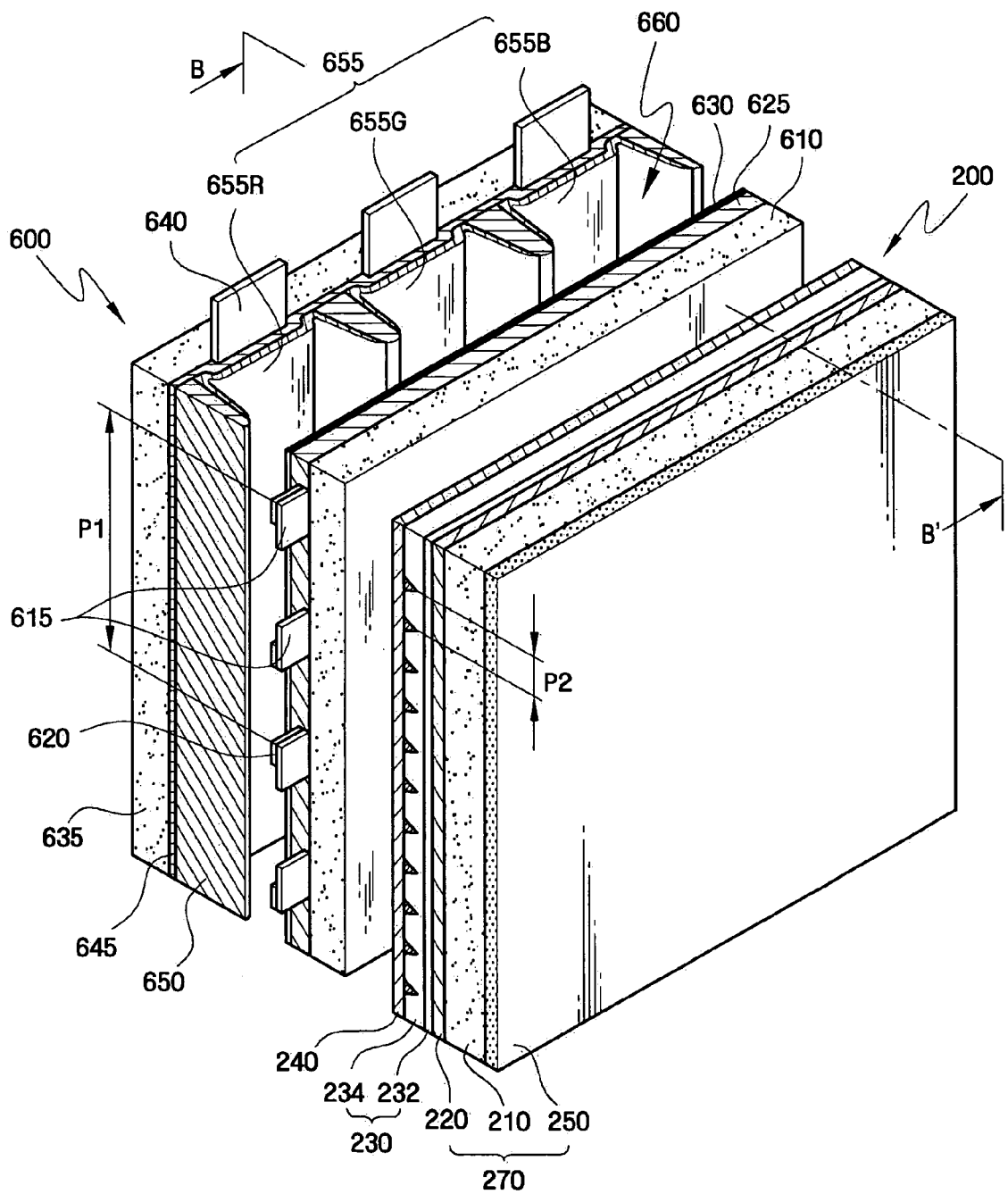
FIG. 6A is an exploded perspective view illustrating a PDP according to an embodiment of the present invention.
Figure 6B:
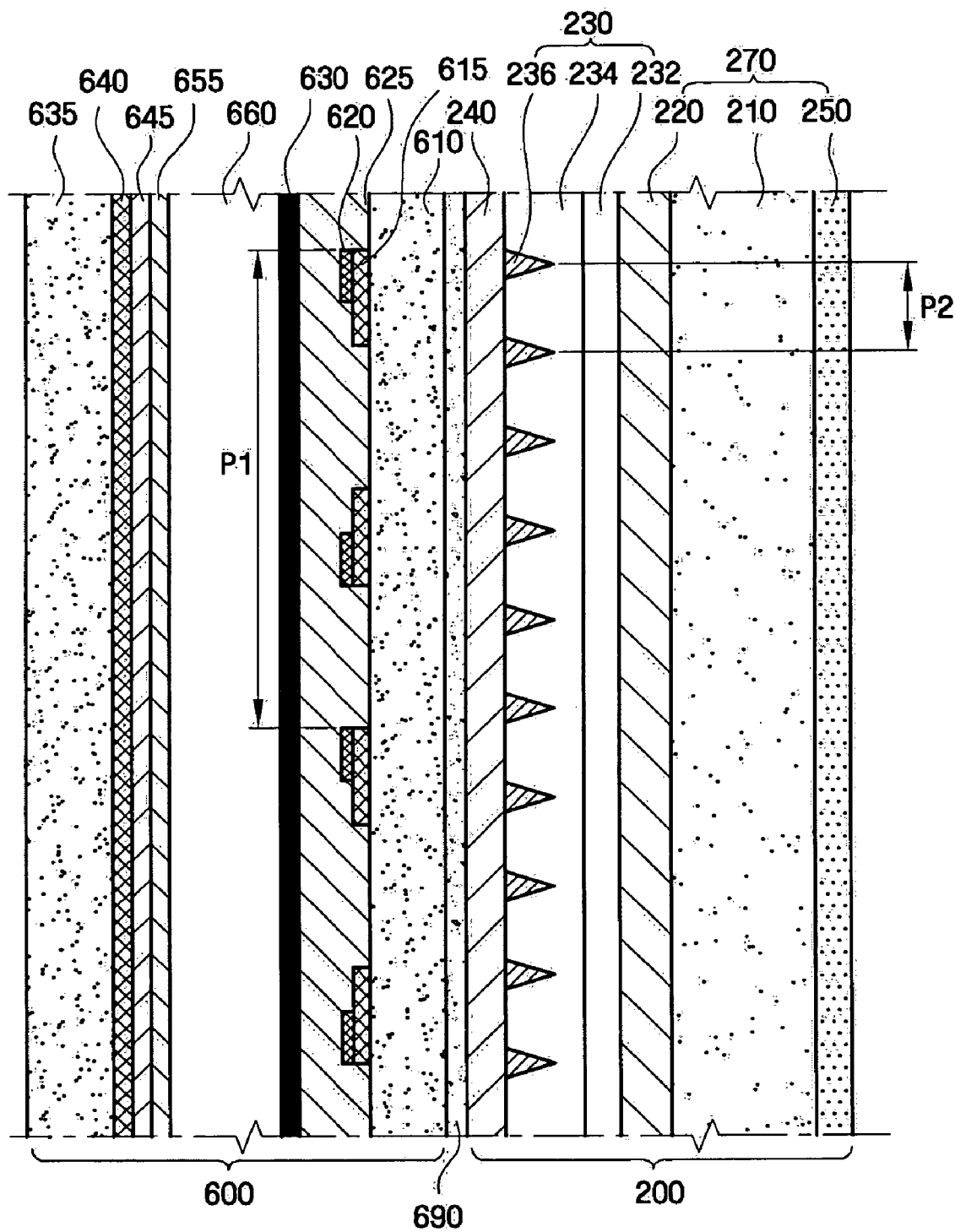
FIG. 6B is a sectional view taken along line B-B' shown in FIG. 6A.

FIG. 6A is an exploded perspective view illustrating a PDP according to an embodiment of the present invention, and FIG. 6B is a sectional view taken along a line B-B' shown in FIG. 6A.

Referring to FIGS. 6A and 6B, a PDP includes a PDP filter 200 and a panel assembly 600. The PDP filter 200 is as described above and, thus, a detailed description thereof will be omitted. Hereinafter, the panel assembly 600 will be described in detail.

Referring to FIG. 6A, a plurality of sustain electrode pairs 615 are disposed in a striped pattern on a surface of a front substrate 610. Each sustain electrode includes a bus electrode 620 to reduce a signal delay. The sustain electrode pairs 615 are entirely covered with a dielectric layer 625. A dielectric protective layer 630 is disposed on the dielectric layer 625. According to an embodiment of the present invention, the dielectric protective layer 630 is formed by covering the dielectric layer 625 with MgO by sputtering, etc.

Meanwhile, a plurality of address electrodes 640 are formed in a striped pattern on a surface of a rear substrate 635 facing the front substrate 610. The address electrodes 640 are formed to intersect with the sustain electrode pairs 615 so that the front substrate 610 and the rear substrate 635 face each other. The address electrodes 640 are entirely covered with a dielectric layer 645. A plurality of partition walls 650 are disposed on the dielectric layer 645 in such a way to be parallel to the address electrodes 640 and project toward the front substrate 610. The partition walls 650 are disposed between two adjacent address electrodes 640.

A phosphor layer 655 is disposed on inside surfaces of grooves defined by the partition walls 650 and the dielectric layer 645. The red phosphor layer 655R, the green phosphor layer 655G, and the blue phosphor layer 655B are respectively formed using red, green, and blue phosphor particles by a thick film formation method such as a screen printing method, an inkjet method, or a photoresist film method. For example, the phosphor layer 655 consisting of the red phosphor layer 655R, the green phosphor layer 655G, and the blue phosphor layer 655B may be made of (Y, Gd)BO$_3$:Eu, Zn$_2$SiO$_4$:Mn, and BaMgAl$_{10}$O$_{17}$:Eu, respectively.

Discharge cells 660, which are defined by the grooves and the dielectric protective layer 630 when the front substrate 610 and the rear substrate 635 are coupled with each other, are filled with a discharge gas. Thus, the discharge cells 660 of the panel assembly 600 are formed at intersections between the sustain electrode pairs 615 of the front substrate 610 and the address electrodes 640 of the rear substrate 635. For example, the discharge gas may be a Ne—Xe gas, a He—Xe gas, etc.

The panel assembly 600 with the above-described structure emits light according to substantially the same principle as a fluorescent lamp. UV light emitted from the discharge gas of the discharge cells 660 excites the phosphor layer 655 to emit visible light.

The red phosphor layer 655R, the green phosphor layer 655G, and the blue phosphor layer 655B are made of phosphor materials having different visible light conversion efficiencies. Thus, a color balance adjustment for image display in the panel assembly 600 is generally performed by adjusting the luminance of the red phosphor layer 655R, the green phosphor layer 655G, and the blue phosphor layer 655B. In detail, based on the phosphor layer with the lowest luminance, the luminance of the other phosphor layers is lowered according to a predetermined ratio.

The driving of the panel assembly 600 is generally classified into driving for address discharge and sustain discharge. The address discharge occurs between the address electrodes 640 and one electrode of the sustain electrode pairs 615. At this time, wall charges are generated. The sustain discharge occurs due to a potential difference between sustain electrode pairs positioned in the discharge cells 660 in which wall charges are generated. During the sustain discharge, the phosphor layer 655 of the discharge cells 660 in which wall charges are generated is excited by UV light emitted from a discharge gas, and the phosphor layer 655 emits visible light. The visible light creates visually recognizable images while passing through the front substrate 610.

A relationship between the panel assembly 600 and the PDP filter 200 will now be described with reference to FIGS. 6A and 6B.

Referring to FIGS. 6A and 6B, the PDP filter 200 is disposed on the front substrate 610 of the panel assembly 600. The PDP filter 200 may be separated from the front substrate 610 of the panel assembly 600, as shown in FIG. 6A. The PDP filter 200 may also be brought into contact with the front substrate 610 of the panel assembly 600.

To avoid side effects, e.g., light of external environments coming into a region between the panel assembly 600 and the PDP filter 200 or to reinforce the strength of the PDP filter 200, the PDP filter 200 may be attached to the front substrate 610 of the panel assembly 600 via an adhesive or bond 690, as shown in FIG. 6B.

To prevent the light of external environments from coming into the panel assembly 600, an external light-shielding layer 230 may be provided in the PDP filter 200. The light of external environments, which is mainly absorbed by the external light-shielding layer 230, can be prevented from being transmitted through the front substrate 610 and reflected back to the external environments. Therefore, the contrast ratio of a PDP for a bright room condition can be enhanced.

Visible light emitted from the discharge cells 660 is focused by total reflection at inclined surfaces 236b of black stripes 236 and then emitted outward. Therefore, light loss is reduced, thereby enhancing the luminance of the PDP.

As shown in FIG. 6B, a pitch P2 between the black stripes 236 may be smaller than a pitch P1 between the discharge cells 660 of the panel assembly 600 that is, when two or more of the black stripes correspond to a unit cell of the discharge cells 660, incident light from the panel assembly 600 can be uniformly distributed and external light can be efficiently absorbed.

Moire fringes can be formed by the periodic patterns of the discharge cells 660 of the panel assembly 600 and the periodic patterns of the black stripes 236 of the external light-shielding layer 230. The term "Moire fringes" is simply used to denote interference fringes created when two or more periodic patterns are superimposed. To prevent such Moire fringes, the pitch P2 of the black stripes 236 may be in a range of about 70 to about 110 μm.

Figure 7A:
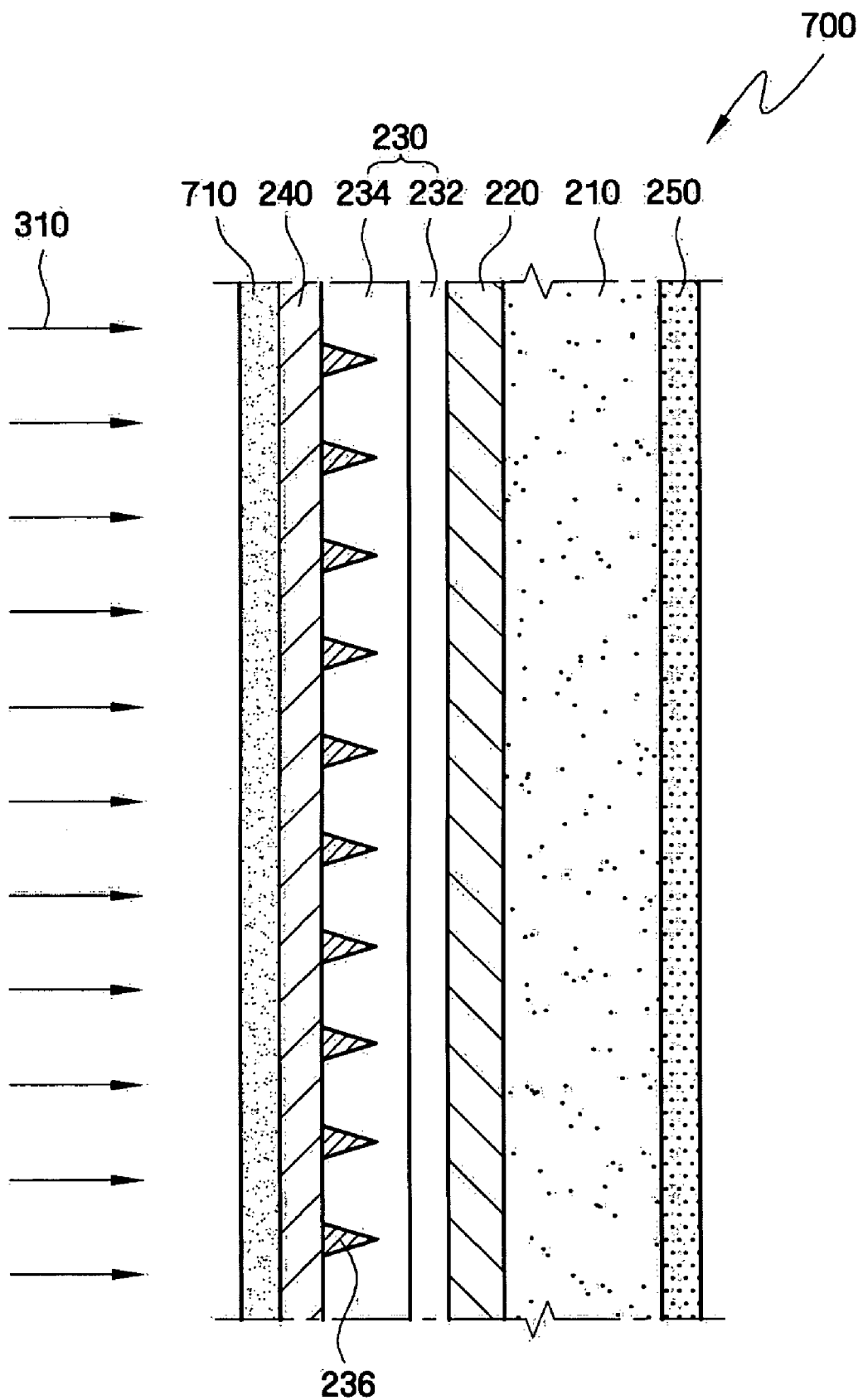
FIG. 7A is a sectional view illustrating a PDP filter according to another embodiment of the present invention.
Figure 7B:
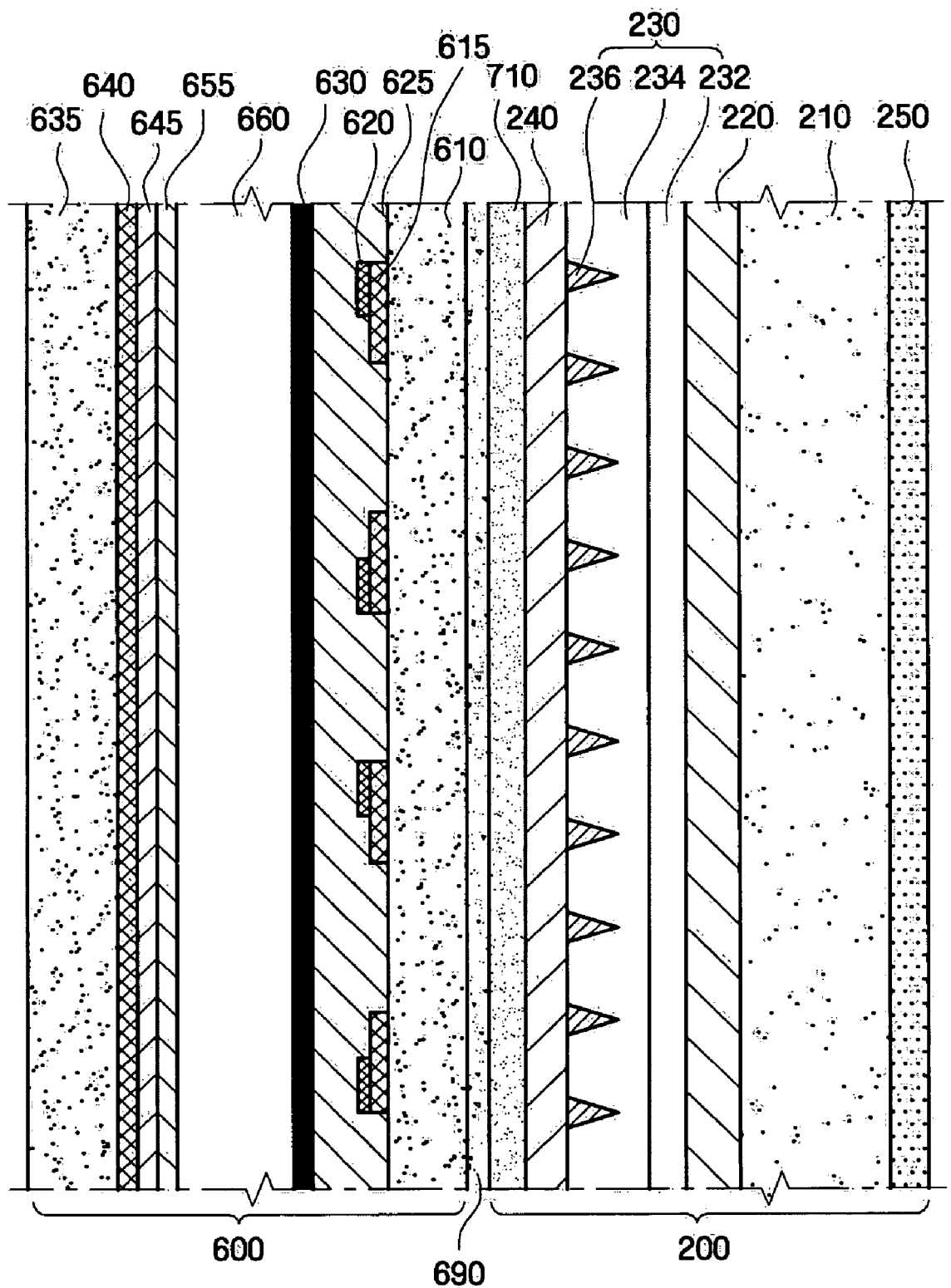
FIG. 7B is a sectional view illustrating a PDP including the PDP filter shown in FIG. 7A.

Hereinafter, a PDP filter according to another embodiment of the present invention will be described with reference to FIGS. 7A and 7B. FIG. 7A is a sectional view illustrating a PDP filter according to another embodiment of the present invention, and FIG. 7B is a sectional view illustrating a PDP including the PDP filter shown in FIG. 7A. For the sake of clarity and ease of explanation, components each having the same function in all the drawings for describing the first embodiment shown in FIGS. 1 through 6B are respectively identified by the same reference numerals, and their repetitive description will be omitted.

Referring to FIGS. 7A and 7B, a PDP filter 700 has substantially the same structure as the PDP filter 200 according to the previous embodiment except that a diffusion layer 710 is used to prevent Moire fringes and a Newton ring phenomenon. When periodic patterns such as light-shielding patterns of black stripes 236 of an external light-shielding layer 230 or the mesh pattern of an EM radiation-shielding layer 220 are reflected at a front substrate 610 of a panel assembly 600, Moire fringes may be generated by interference between the original pattern and the reflected light pattern. When a distance between the PDP filter 700 and the front substrate 610 of the panel assembly 600 is not uniformly maintained, the Newton ring phenomenon may occur. The diffusion layer 710 diffuses the reflected light pattern so that the interference between the original pattern and the reflected light pattern does not occur, thereby preventing Moire fringes and the Newton ring phenomenon. The diffusion layer 710 may be positioned on a surface of the PDP filter 700 closer to the panel assembly 600, but the position of the diffusion layer 710 can be changed as long as the Moire fringes and Newton ring phenomenon can be prevented, that is, the diffusion layer 710 may also be disposed on the viewer's side of the PDP filter 700, i.e., on an antireflective layer 250.

The diffusion layer 710 may be an anti-glare treatment film. Here, the "anti-glare treatment" refers to the formation of a fine concave-convex structure on a surface of a film using an appropriate method such as a rough surfacing treatment method, e.g., sandblasting or embossing, or a method of combining transparent microparticles. Examples of suitable transparent particles having a particle size of 0.1 to 5 mm include silica, alumina, titania, zirconia, inorganic conductive particles such as tin oxide, indium oxide, cadmium oxide or antimony oxide, organic conductive particles such as cross-linked or noncross-linked polymers, and so on.

Figure 8:
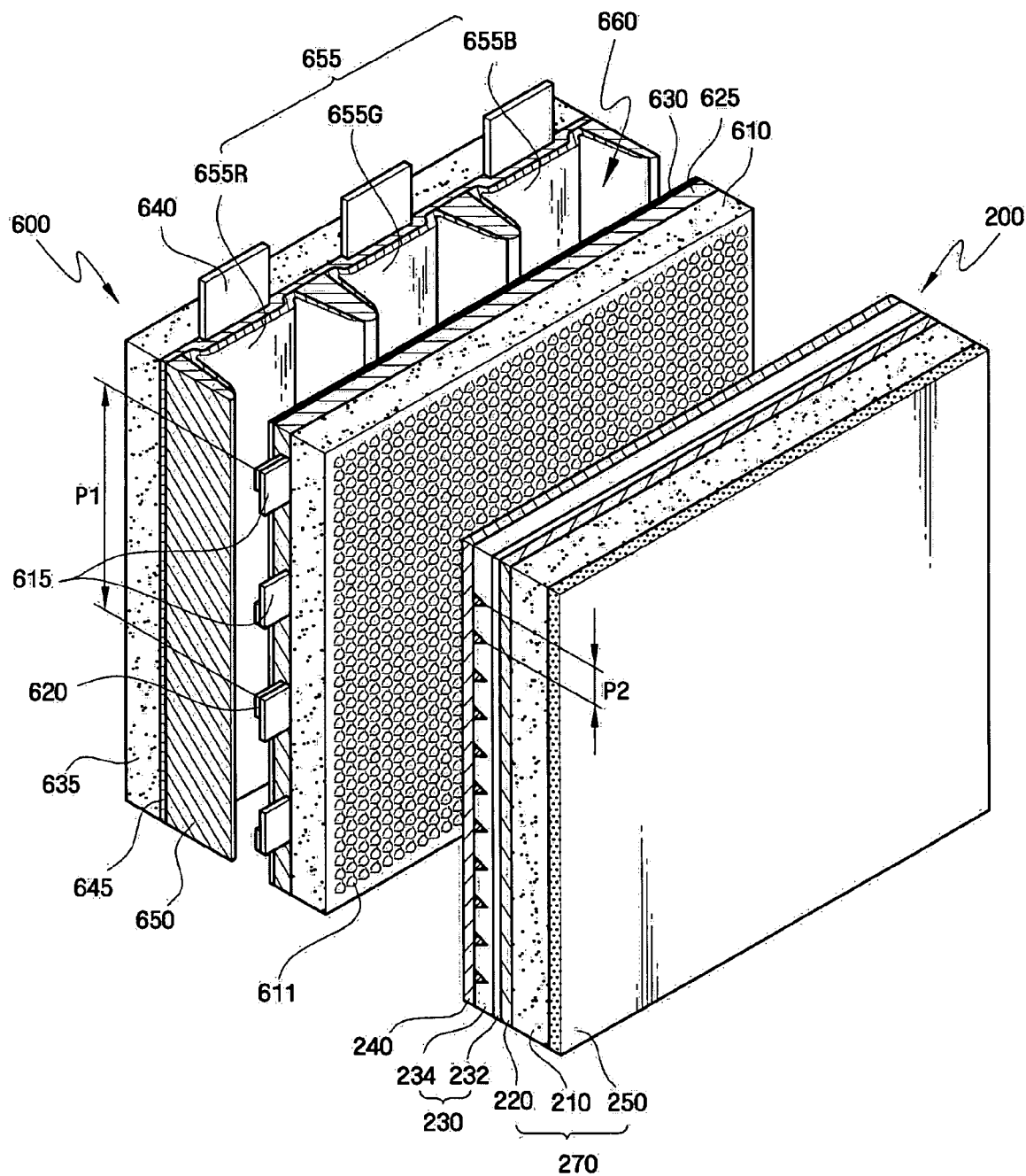
FIG. 8 is an exploded perspective view illustrating a PDP according to another embodiment of the present invention.

Hereinafter, a PDP according to another embodiment of the present invention will be described with reference to FIG. 8. FIG. 8 is an exploded perspective view illustrating a PDP according to another embodiment of the present invention. For the sake of clarity and ease of explanation, components each having the same function in all the drawings for describing the first embodiment shown in FIGS. 1 through 6B are respectively identified by the same reference numerals, and their repetitive description will be omitted.

Referring to FIG. 8, a PDP filter 200 has substantially the same structure as the PDP filter 700 shown in FIGS. 7A and 7B, except those given below; that is, in the current embodiment of the present invention, to prevent the Moire fringes and the Newton ring phenomenon, a diffuse-reflection surface 611 formed by anti-glare treatment of a front substrate 610 of a panel assembly 600 is substituted for the diffusion layer 710 shown in FIGS. 7A and 7B. The diffuse-reflection surface 611 of the front substrate 610 facing the PDP filter 200 is an anti-glare treated surface and induces the diffuse reflection of light so that light reflected from the front substrate 610 does not have a constant pattern, thereby preventing an interference phenomenon, resulting in no Moire fringes nor the Newton ring phenomenon. The PDP of the current embodiment of the present invention may also include the PDP filter 700 which includes the diffusion layer 710 shown in FIGS. 7A and 7B.

Figure 9A:
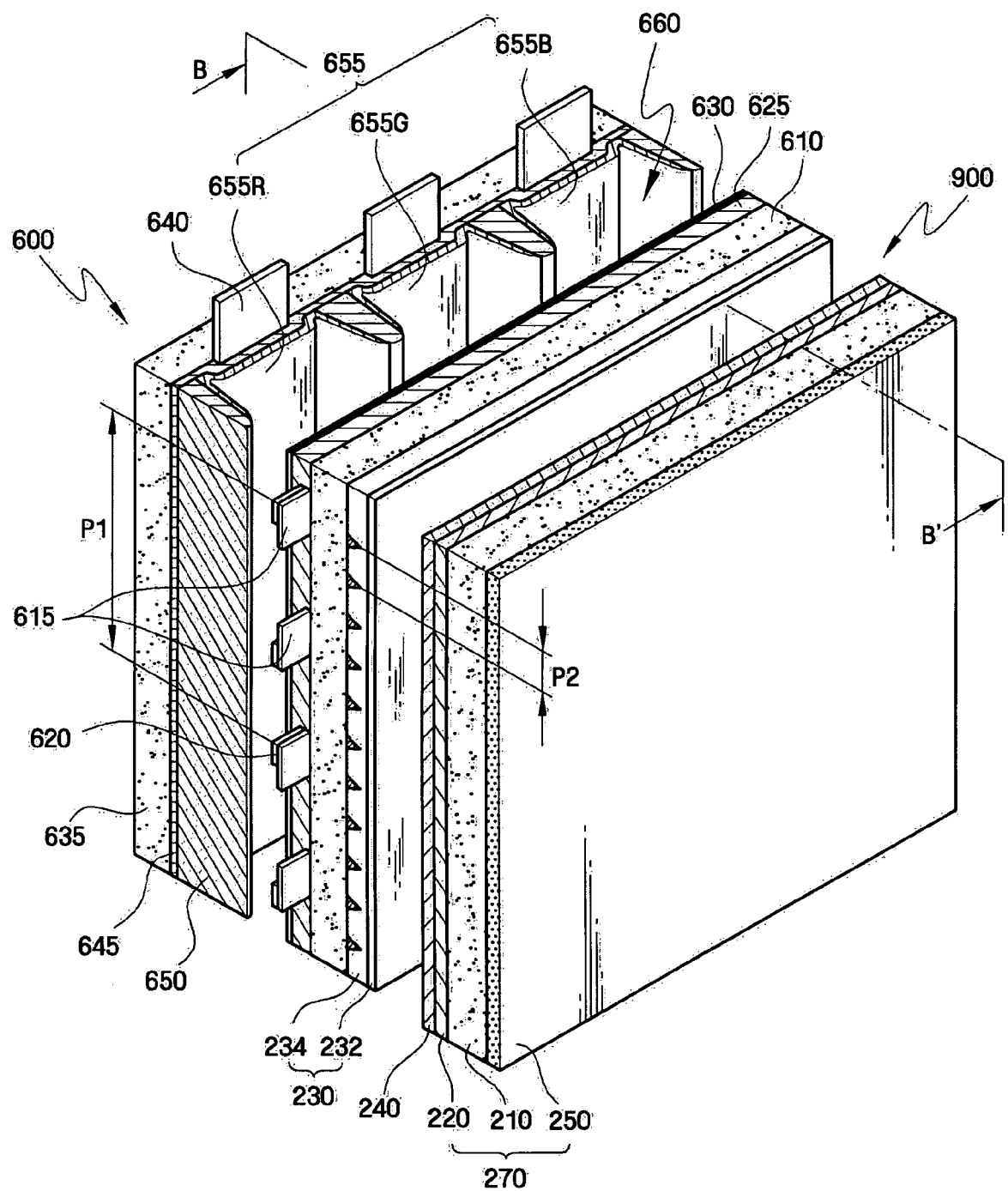
FIG. 9A is an exploded perspective view illustrating a PDP according to still another embodiment of the present invention.
Figure 9B:
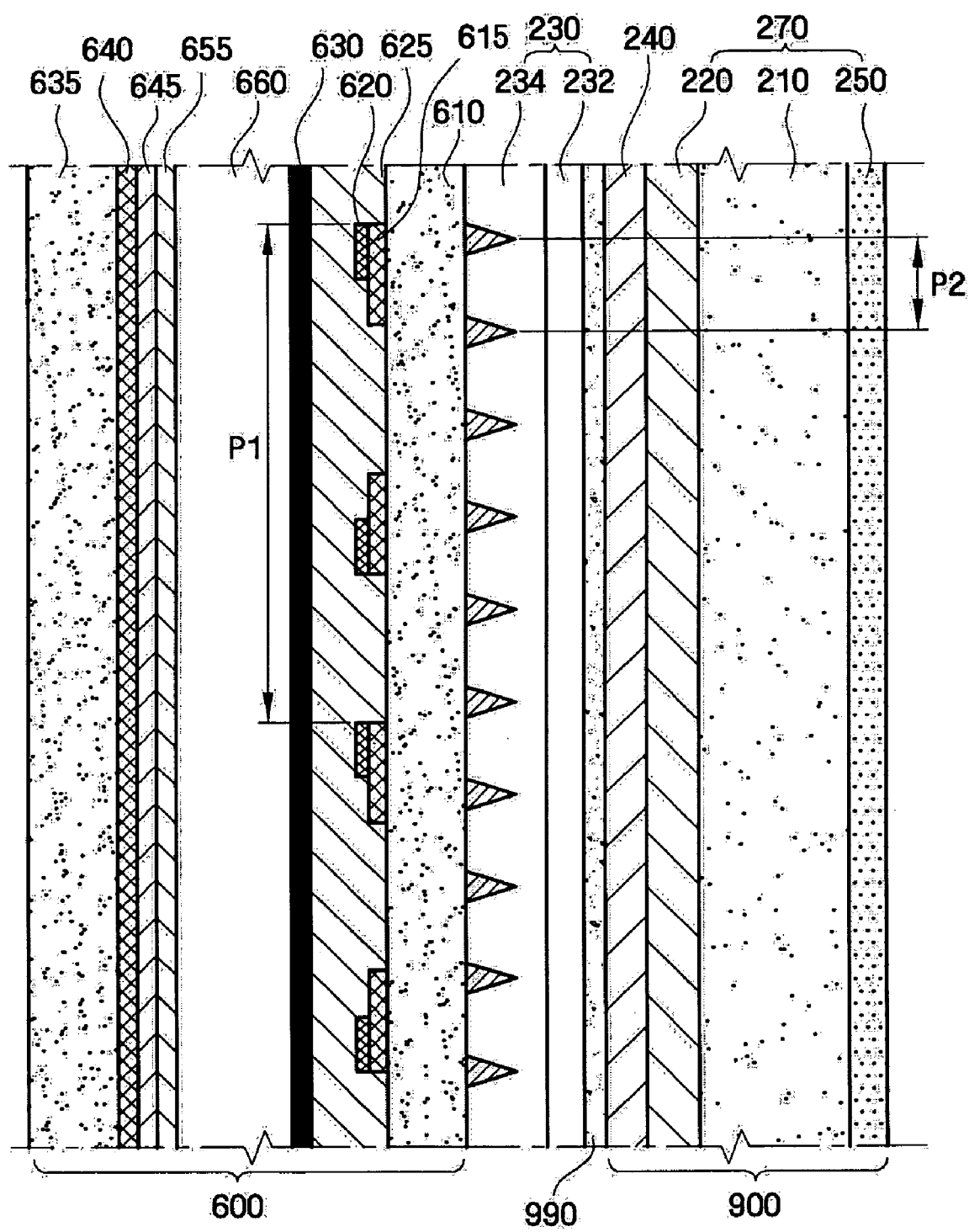
FIG. 9B is a sectional view taken along line B-B' shown in FIG. 9A.

Hereinafter, a PDP according to still another embodiment of the present invention will be described with reference to FIGS. 9A and 9B. FIG. 9A is an exploded perspective view illustrating a PDP according to yet another embodiment of the present invention, and FIG. 9B is a sectional view taken along a line B-B' shown in FIG. 9A. For the sake of clarity and ease of explanation, components each having the same function in all the drawings for describing the first embodiment shown in FIGS. 1 through 6B are respectively identified by the same reference numerals, and their repetitive description will be omitted.

While the above-described embodiments of the present invention have illustrated that an external light-shielding layer, together with a filter base, constitutes a PDP filter, in the current embodiment of the present invention, an external light-shielding layer may be directly formed on or attached to a front substrate of a panel assembly, and a filter base may be disposed on the external light-shielding layer to thereby complete a PDP.

Referring to FIGS. 9A and 9B, an external light-shielding layer 230 is directly disposed on or attached to a front substrate 610 of a panel assembly 600. A PDP filter 900 including a filter base 270 and a color correction layer 240 may be separated from the external light-shielding layer 230 of the front substrate 610 by a predetermined distance, as shown in FIG. 9A. Alternatively, to avoid side effects, e.g., light of external environments coming into a region between the panel assembly 600 and the PDP filter 900 or to reinforce the strength of the PDP filter 900, the PDP filter 900 may be attached to the front substrate 610 of the panel assembly 600 via an adhesive or bond 990, as shown in FIG. 9B.

The aforementioned PDP can also provide the same functions and advantages as those of the previous embodiments of the present invention.

While the embodiments of the present invention have been described separately, a combination of two or more embodiments among those embodiments that have been described above may also be within the scope of the present invention.

The display filter, the display device including the display filter, and the method of manufacturing the display filter according to the present invention provide at least the following advantages.

First, wedge-shaped black stripes of a PDP filter can focus visible light generated from discharge cells by total reflection at inclined surfaces of the black stripes and then emit the focused visible light outward, thereby increasing the transmittance and luminance of a PDP.

Second, since the wedge-shaped black stripes of the PDP filter are made of a light-absorbing material, the entrance of external light into a panel assembly is prevented, thereby enhancing the contrast ratio of a PDP for a bright room condition.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A display filter comprising:
   a filter base; and
   an external light-shielding layer disposed on a surface of the filter base and having a matrix made of a substantially transparent resin and a plurality of wedge-shaped black stripes arranged parallel to each other at a surface of the matrix,
   wherein a pitch of the black stripes is smaller than a pitch of discharge cells of a panel assembly.

2. The display filter of claim 1, wherein each of the plurality of wedge-shaped black stripes comprises a bottom portion exposed on one surface of the matrix facing a panel assembly, and inclined surfaces extending from the bottom portion and defining a wedge-shaped groove in the matrix.

3. The display filter of claim 2, wherein an area of the bottom portion of the black stripes is about 20 to 50% of the surface of the matrix facing the panel assembly.

4. The display filter of claim 2, wherein an angle between each of the inclined surfaces and the bottom portion of the black stripes is in a range of about 80 to about 89 degrees.

5. The display filter of claim 2, wherein each of the inclined surfaces of the black stripes is bent once or more.

6. The display filter of claim 5, wherein each of the inclined surfaces of the black stripes comprises a first inclined surface extending from the bottom portion and a second inclined surface connected to an end portion of the wedge-shaped groove.

7. The display filter of claim 6, wherein an angle between the first inclined surfaces and the bottom portion is smaller than an angle between an imaginary plane extending from the second inclined surface and the bottom portion.

8. The display filter of claim 6, wherein the angle between the first inclined surface and the bottom portion and the angle between an imaginary plane extending from the second inclined surface and the bottom portion are in a range of about 80 to about 89 degrees.

9. The display filter of claim 1, wherein the black stripes are arranged in a transverse direction with respect to a viewer.

10. The display filter of claim 1, wherein the black stripes are made of a black inorganic material and/or organic material, or a metal.

11. The display filter of claim 1, wherein the external light-shielding layer has a visible light transmittance of about 70% or greater.

12. The display filter of claim 1, wherein the pitch of the black stripes is in a range of about 70 to 110 μm.

13. The display filter of claim 1, wherein the refractive index of each of the black stripes is smaller than the refractive index of the matrix, and the difference in the refractive index between the matrix and the black stripes is about 0.05 or less.

14. The display filter of claim 1, wherein the external light-shielding layer further comprises a support supporting the matrix.

15. The display filter of claim 1, further comprising a color correction layer having a transmittance of about 60% or greater in a wavelength range of about 580 to 600 nm.

16. The display filter of claim 1, further comprising a diffusion layer on a surface of the display filter facing a panel assembly.

17. The display filter of claim 16, wherein the diffusion layer is an anti-glare treatment film.

18. A display device comprising:
a panel assembly having a substantially transparent front substrate and a rear substrate disposed to face each other, and a plurality of cells between the front substrate and the rear substrate; and
a display filter of claim 1, facing the front substrate of the panel assembly.

19. The display device of claim 18, wherein the panel assembly and the display filter are attached to each other by means of an adhesive or a bond.

20. The display device of claim 18, wherein the front substrate has a diffuse-reflection surface formed by anti-glare treatment.

21. The display device of claim 18, wherein the contrast ratio is about 250:1 or more while the display filter is maintaining a visible light transmittance of 50% or greater.

22. A display device comprising:
a panel assembly including a substantially transparent front substrate and a rear substrate disposed to face each other, and a plurality of cells between the front substrate and the rear substrate;
an external light-shielding layer disposed on a surface of the panel assembly and having a matrix made of a substantially transparent resin and a plurality of wedge-shaped black stripes arranged parallel to each other at a surface of the matrix; and
a display filter facing the external light-shielding layer and having an antireflection shielding function and/or an electro magnetic radiation shielding function, a near-infrared ray wave shielding function, or a combination thereof,
wherein a pitch of the black stripes is smaller than a pitch of discharge cells of a panel assembly.

* * * * *